United States Patent
Yamamoto et al.

(10) Patent No.: US 7,012,435 B2
(45) Date of Patent: Mar. 14, 2006

(54) STATE DETECTING METHOD AND INSULATION RESISTANCE FALL DETECTOR

(75) Inventors: Kouichi Yamamoto, Shizuoka (JP); Satoshi Ishikawa, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 10/959,576

(22) Filed: Oct. 7, 2004

(65) Prior Publication Data
US 2005/0073320 A1    Apr. 7, 2005

(30) Foreign Application Priority Data
Oct. 7, 2003    (JP) ............... P.2003-347894

(51) Int. Cl.
*G01R 31/00* (2006.01)
*G08B 21/00* (2006.01)

(52) U.S. Cl. ............. 324/527; 324/503; 324/509; 324/551; 340/647

(58) Field of Classification Search ........... 324/527
See application file for complete search history.

(56) References Cited

U.S. PATENT DOCUMENTS 6,906,525 B1 *  6/2005  Suzuki  ............... 324/509

FOREIGN PATENT DOCUMENTS

JP    8-70503    3/1996

* cited by examiner

*Primary Examiner*—Vincent Q. Nguyen
*Assistant Examiner*—Timothy J. Dole
(74) *Attorney, Agent, or Firm*—Finnegan, Henderson, Farabow, Garrett & Dunner, L.L.P.

(57) ABSTRACT

A method of detecting a state of an insulation resistance fall detector that includes: a detection resistance connected in series to an insulation resistance between a vehicle body and a power source; a condenser provided between the insulation resistance and the detection resistance; a pulse signal applying unit that applies a pulse signal to a serial circuit constituted by the insulation resistance, the condenser and the detection resistance; a low pass filter that filters a voltage of a connecting point between the coupling condenser and the detection resistance; and a fall detecting unit that detects a fall of the insulation resistance on the basis of the output of the filter, the method comprising the steps of: varying a pulse width of the pulse signal; and detecting the state of the insulation resistance fall detector on the basis of the output of the filter when the pulse width is varied.

9 Claims, 6 Drawing Sheets

RECTANGULAR WAVE
PULSE SIGNAL

OUTPUT OF LOW PASS FILTER
DURING NORMAL STATE

OUTPUT OF LOW PASS FILTER
DURING FAILED STATE

OUTPUT OF OSCILLATOR

BEFORE DETECTION OF EARTH    AFTER DETECTION OF EARTH

VOLTAGE OF CONNECTING POINT P

COMPARATOR 21

SMOOTHING CIRCUIT 26

COMPARATOR 27

US 7,012,435 B2

STATE DETECTING METHOD AND INSULATION RESISTANCE FALL DETECTOR

BACKGROUND OF THE INVENTION

The present invention relates to a state detecting method for detecting the state of an insulation resistance detecting circuit for detecting an insulation resistance between a vehicle body and a DC power source and an insulation resistance fall detector in which the state detecting method is carried out.

Usually, as the above-described insulation resistance fall detector, an earth detecting circuit of an electric motor vehicle, which is disclosed in, for instance, Patent Document 1 is exemplified. The earth detecting circuit serves to detect an earth to a vehicle body E from a battery group B, as shown in FIGS. 5 and 6, in the travel driving circuit system A of the electric motor vehicle comprising the battery group B provided as a high voltage DC power source (for instance, 200 to 300 V), an inverter 2 as a DC-AC converter for converting a direct current fed through a plus bus bar 4 as an anode DC feeder and a minus bus bar 5 as a cathode DC feeder from the battery group B to an alternating current, and an alternating current electric motor (an AC electric motor) 3 to which the alternating current is fed through a U phase line 6, a V phase line 7 and a W phase line 8 as the alternating current (AC) feeders from the inverter 2. The ground detecting circuit includes an oscillation circuit 10 as an alternating current (AC) signal output circuit and a detecting part 20 as a voltage level change detecting circuit. A connecting point P of the oscillation circuit 10 and the detecting part 20 is connected to the plus bus bar 4 of the battery group B of the travel driving circuit system A by a coupling condenser 10A to interrupt a direct current (DC) component.

In the oscillation circuit 10, an oscillator 11 generates a rectangular wave pulse of a predetermined frequency with a duty ratio of 50% (see the right and left parts of FIG. 6A). An impedance converter 12 of a next stage outputs the rectangular wave pulse of the oscillator 11 with the duty ratio as it is. An alternating current (AC) signal output of the oscillation circuit 10 appears in the connecting point P through a detection resistance 13. The detection resistance 13 serves as a potential divider together with an earth resistance 31 upon generation of the earth.

The detecting part 20 is provided with a comparator 21 for comparing the voltage level of the connecting point P of the detection resistance 13 and the coupling condenser 10A at which the AC signal output of the oscillation circuit 10 appears with reference voltage V1. The connecting point P is connected to an inverse input terminal of the comparator 21. To a non-inverse input terminal of the comparator 21, a reference voltage circuit to which the reference voltage V1 is set by potential dividing resistances 22 and 23 is connected.

Protecting diodes 15 to 18 are connected to the output side of the impedance converter 12 and the input side of the comparator 21 to protect an operational amplifier forming the impedance converter 12 and the comparator 21 from reverse voltage and over-voltage upon generation of the earth.

According to the above-described circuit structure, when the earth is not ordinarily generated, the insulation resistance 31 can be considered to be infinite. From the connecting point P at which a value obtained by dividing the potential of the rectangular wave pulse by the insulation resistance 31 and the detection resistance 13 appears, a rectangular wave pulse of a peak value higher than a preset reference voltage V1 is outputted (see the left side of FIG. 6D).

Thus, to the inverse input terminal of the comparator 21, the rectangular wave pulse having the peak value higher then the preset reference voltage V1 is inputted. The output of the comparator 21 is the rectangular wave pulse having a duty ratio of 50% (see the left side of FIG. 6C). Then, smooth voltage Vr obtained by a smoothing circuit 26 having a resistance 24 and a condenser 25 is lower than the reference voltage (see the left side of FIG. 6D). The smooth voltage is inputted to the non-inverse input terminal of a comparator 27 and the output of the comparator 27 becomes a low level showing a normal state (see the left side of FIG. 6E).

However, when the earth is generated between the minus bus bar and the vehicle body E to lower the insulation resistance 31 shown in FIG. 5, from the connecting point P at which the value obtained by dividing the potential of the rectangular wave pulse by the insulation resistance 31 and the detection resistance 13 appears, a rectangular wave pulse of a peak value lower than the reference voltage V1 is outputted (see the right side of FIG. 6(b)). Thus, to the inverse input terminal of the comparator 21, the rectangular wave pulse having the peak value lower then the reference voltage V1 is inputted. The duty ratio of the comparator 21 is changed to 100% (see the right side of FIG. 6C)

As a result, the smooth voltage Vr obtained by the smoothing circuit 26 having the resistance 24 and the condenser 25 is higher than the reference voltage (see the right side of FIG. 6D). The smooth voltage is inputted to the non-inverse input terminal of the comparator 27 and the output of the comparator 27 becomes a high level showing the fall of the insulation resistance (see the right side of FIG. 6E). As described above, when the earth is generated in the battery group B, the earth can be detected from the logical level of the comparator 27. Patent Document 1: JP-A-8-70503

However, in the above-described earth detecting circuit, whether the earth detecting circuit itself is in a failed state or a normal state can not be disadvantageously detected.

SUMMARY OF THE INVENTION

Thus, the present invention notices the above-described problem and it is an object to provide a state detecting method capable of detecting the state of an insulation resistance fall detector itself and an insulation resistance fall detector in which the state detecting method is carried out.

In order to solve the aforesaid object, the invention is characterized by having the following arrangement.

(1) A method of detecting a state of an insulation resistance fall detector that includes: a detection resistance connected in series to an insulation resistance between a vehicle body and a DC power source; a coupling condenser provided between the insulation resistance and the detection resistance; a pulse signal applying unit that applies a pulse signal to a serial circuit constituted by the insulation resistance, the coupling condenser and the detection resistance; a filter that removes a signal component of a predetermined frequency from a voltage of a connecting point between the coupling condenser and the detection resistance; and a fall detecting unit that detects a fall of the insulation resistance on the basis of the output of the filter, the state detecting method comprising the steps of:

varying a pulse width of the pulse signal; and detecting the state of the insulation resistance fall detector on the basis of the output of the filter when the pulse width is varied.

(2) The method according to (1), wherein the pulse width of the pulse signal is varied so as to be shorter than a pulse width outputted when a detection is carried out by the fall detecting unit.

(3) The method according to (2), wherein a normal state of the insulation resistance fall detector is detected if the output of the filter is considered to change at the time of varying the pulse width so as to be short.

(4) The method according to (3), wherein the pulse signal of a first pulse width is outputted upon detection by the fall detecting unit, the pulse signal of a second pulse width shorter than the first pulse width is outputted upon detection of the state of the fall detecting unit, when the output of the filter upon outputting the pulse signal of the first pulse width is not lower than a first predetermined value and the output of the filter upon outputting the pulse signal of the second pulse width is not higher than a second predetermined value smaller than the first predetermined value, a normal state of the insulation resistance fall detector is detected.

(5) The method according to (2), wherein a failed state of the insulation resistance fall detector is detected if the output of the filter is considered to be a third predetermined value or higher and have no variation at the time of varying the pulse width so as to be short.

(6) The method according to (5), wherein the failed state of the insulation resistance fall detector is detected if the output of the filter is considered to be not higher than a fourth predetermined value smaller than the third predetermined value and have no variation at the time of varying the pulse width to be short.

(7) The method according to (1), wherein a duty of the pulse signal is varied to vary the pulse width.

(8) An insulation resistance fall detector for detecting an insulation resistance between a vehicle body and a DC power source, the insulation resistance fall detector comprising:

a detection resistance connected in series to the insulation resistance;

a coupling condenser provided between the insulation resistance and the detection resistance;

a pulse signal applying unit that applies a pulse signal to a serial circuit constituted by the insulation resistance, the coupling condenser and the detection resistance;

a filter that removes a signal component of a predetermined frequency from a voltage of a connecting point between the coupling condenser and the detection resistance;

a fall detecting unit that detects a fall of the insulation resistance on the basis of the output of the filter;

a pulse width varying unit that varies a pulse width of the pulse signal; and a state detecting unit that detecting a state of the insulation resistance fall detector on the basis of the output of the filter when the pulse width is varied.

(7) The insulation resistance fall detector according to (6), wherein the filter includes a low pass filter.

According to the invention, the pulse width is varied, so that the difference in the rise time of the output of the filter between during the normal state and the failed state appears as the difference in the output of the filter. Therefore, the state detecting method by which the state of the insulation resistance fall detector itself can be detected on the basis of the output of the filter when the pulse width is varied and the insulation resistance fall detector in which the state detecting method is carried out can be obtained.

According to the invention, the pulse width of the pulse signal is varied so as to be shorter than the pulse width outputted when a detection is carried out by the fall detecting unit. Accordingly, the difference in the rise time of the output of the filter between during the normal state and during the failed state appears as the difference in the output of the filter. Therefore, the state detecting method by which the state of the insulation resistance fall detector itself can be detected on the basis of the output of the filter when the pulse width is varied can be obtained.

According to the invention, the state detecting method can be obtained by which when the time constant of the filter is lowered and the rise time of the output of the filter is considered to be not shorter than that during the normal state, the normal state of the insulation resistance fall detector can be detected.

According to the invention, when the output of the filter is compared with the first and second predetermined values, the variation of the output of the filter can be simply decided. Thus, the state detecting method that can be carried out by a simple structure can be obtained.

According to the invention, the state detecting method can be obtained by which for instance, when a failure that the coupling condenser is opened or the time constant of the filter is lowered due to the failure of the filter and the rise time of the output of the filter to the output of the pulse signal is shorter than that at a normal time is generated, a failed state can be detected.

According to the invention, the state detecting method can be obtained by which when a failure that the output of the filter does not rise in accordance with the output of the pulse signal such as the short circuit of the coupling condenser or the filter or the like is generated, the failed state can be detected.

According to the invention, since a simple structure that the duty of the pulse signal is varied enables the pulse width of the pulse signal to be varied, the state detecting method that can be carried out by the simple structure can be obtained.

DETAILED DESCRIPTION OF PREFERRED EMBODIMENTS

Figure 1:
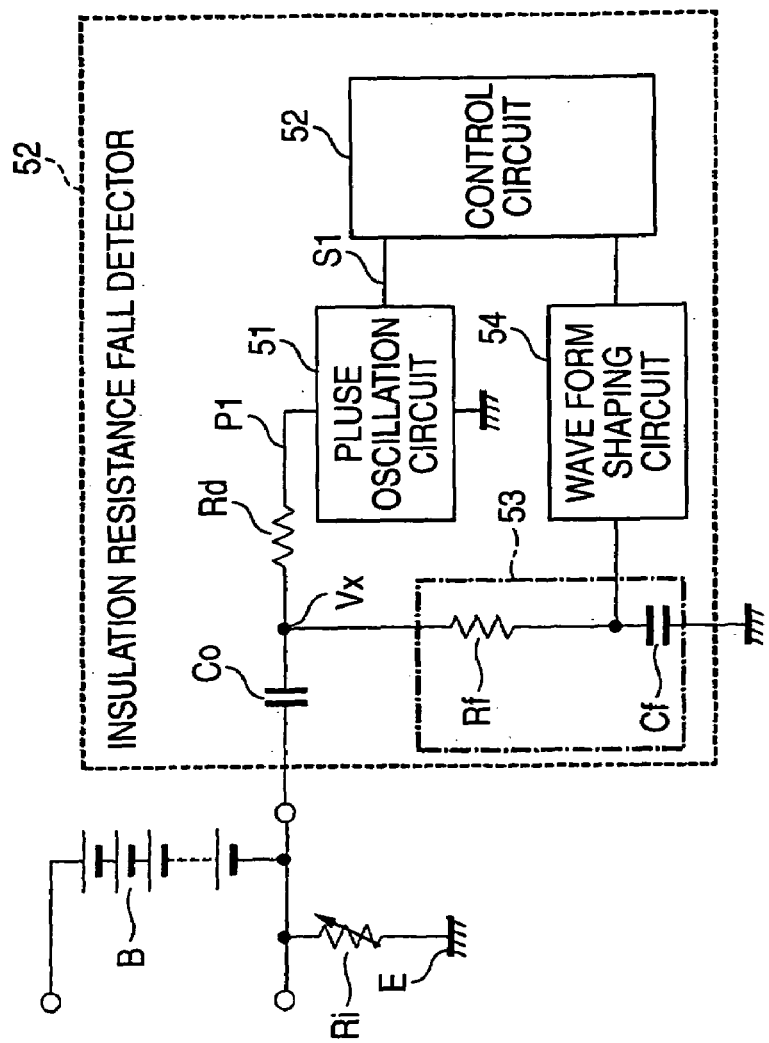
FIG. 1 is a circuit diagram showing one embodiment of an insulation resistance fall detector in which a state detecting method of the present invention is carried out.

Now, a state detecting method and an insulation resistance fall detector according to the present invention will be described by referring to the drawings. FIG. 1 is a circuit diagram showing one embodiment of the insulation resistance fall detector in which the state detecting method according to the present invention is carried out. As shown in FIG. 1, the insulation resistance fall detector 50 includes a detection resistance Rd connected in series to an insulation resistance Ri between a battery group B as a DC power source and a vehicle body E and a coupling condenser Co for interrupting a direct current provided between the insulation resistance Ri and the detection resistance Rd. Further, in a serial circuit having the insulation resistance Ri, the coupling condenser Co and the detection resistance Rd, a pulse oscillation circuit 51 (a pulse signal applying unit) for applying a rectangular wave pulse signal P1 of a predetermined peak value is provided. Here, the peak value means the height of a part having the highest voltage in one pulse signal.

The above-described pulse oscillation circuit 51 includes, for instance, a chopping wave forming circuit for forming a chopping wave from the rectangular wave pulse signal of a predetermined duty and a comparator (both members are not shown in the drawing) for comparing the formed chopping wave with reference voltage. The reference voltage is changed by a control signal S1 from a control circuit 52 to change the duty of the rectangular wave pulse outputted from the comparator.

Further, in the voltage Vx of a connecting point between the coupling condenser Co and the detection resistance Rd, a value appears which is obtained by dividing the peak value of the rectangular wave pulse signal by the detection resistance Rd and the insulation resistance Ri in accordance with a formula (1).

$$Vx = Vp \times Ri/(Rd+Ri) \quad (1)$$

(Here, Vp represents a peak value of the rectangular wave pulse signal P1)

Accordingly, during a normal state in which the insulation resistance Ri is higher than the detection resistance Rd, a pulse having a peak value substantially the same as that of the rectangular wave pulse signal P1 appears in the voltage Vx of the connecting point. On the other hand, when the insulation resistance Ri is lowered to be lower than the detection resistance Rd, the voltage Vx of the connecting point is also lowered.

Further, in the above-described insulation resistance fall detector 50, a low-pass filter 53 (a filter) is further provided for removing a signal component having a frequency not lower than a predetermined frequency from the voltage Vx of the connecting point. The low-pass filter 53 is composed of a resistance Rf and a condenser Cf and is provided for the purpose of removing noise superimposed on the voltage Vx of the connecting point. The output of the low-pass filter 53 is supplied to the control circuit 52 after its wave form is shaped in a wave form shaping circuit 54. The control circuit 52 is composed of, for instance, a microcomputer.

Now, a principle of the state detecting method of the insulation resistance fall detector will be described below by referring to FIGS. 2 to 4. (a) of FIG. 2 is a graph showing the relation of the peak value of the output of the low-pass filter 53 relative to the pulse width of the rectangular wave pulse signal P1 during a normal state in which the insulation resistance Ri is not lowered and the insulation resistance fall detector 50 is not failed.

Figure 2:
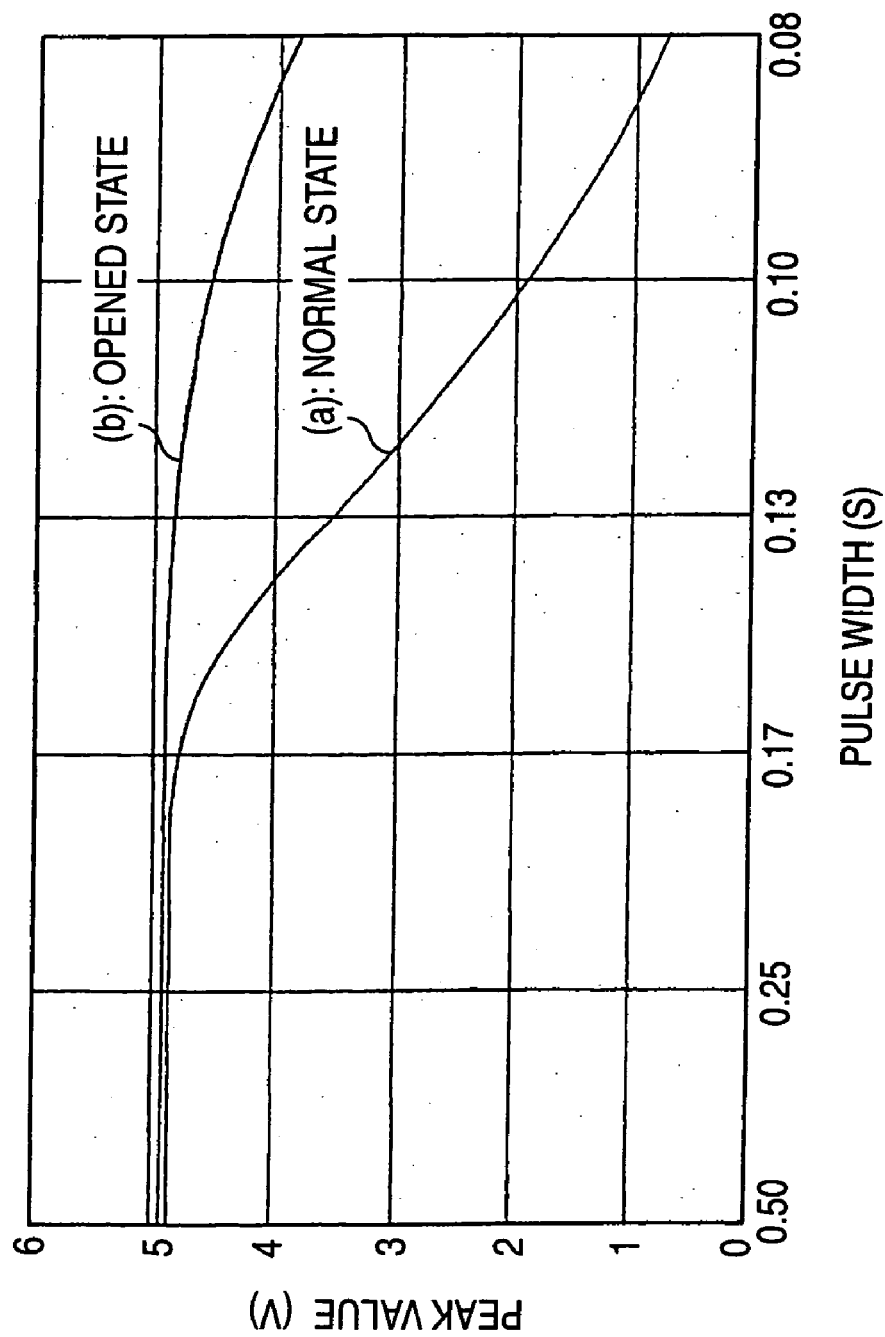
FIG. 2 is a graph showing the relation of the peak value of the output of a low-pass filter 53 relative to the pulse width of a rectangular wave pulse signal P1 during a normal state and during an opened state.

As shown in (a) of FIG. 2, under the normal state, when the pulse width supplied from the pulse oscillation circuit 51 is longer than 0.17(s), the peak value of the output of the low-pass filter 53 is substantially equal to the peak value of the rectangular wave pulse signal P1 outputted from the pulse oscillation circuit 51. On the contrary, as the pulse width supplied from the pulse oscillation circuit 61 is shorter than 0.17(s), the peak value of the output of the low-pass filter 53 is also lowered.

Specifically, for instance, when the rectangular wave pulse signal P1 having the pulse width of 0.13(s) shorter than 0.17(S) is supplied, the peak value of the output of the low-pass filter 53 is 3.66 (V). When the pulse width is 0.10 (s) further shorter than 0.17(S), the peak value of the output of the low-pass filter is 1.92 (V). When the pulse width is 0.08(S), the peak value is 0.72(V).

This phenomenon is generated, because the output of the low-pass filter 53 during the normal state transiently increases toward the peak value (for instance, 5(V)) of the rectangular wave pulse signal P1 in accordance with the output of the rectangular wave pulse signal P1 and 0.17(S) is required for rise time (see full lines in FIGS. 4(a) and 4(b)).

Figure 4:
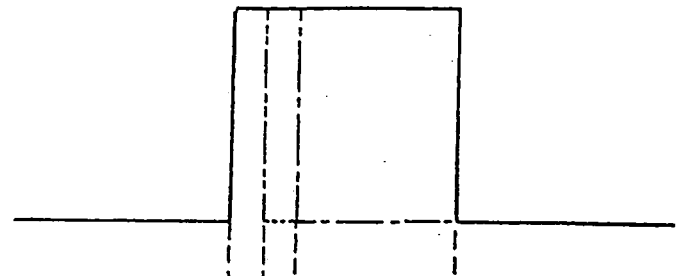
FIGS. 4A, 4B and 4C are time charts respectively showing a rectangular wave pulse signal P1, an output of the low-pass filter 53 during a normal state and the output of the low-pass filter 53 during an opened and failed state.
Figure 4:
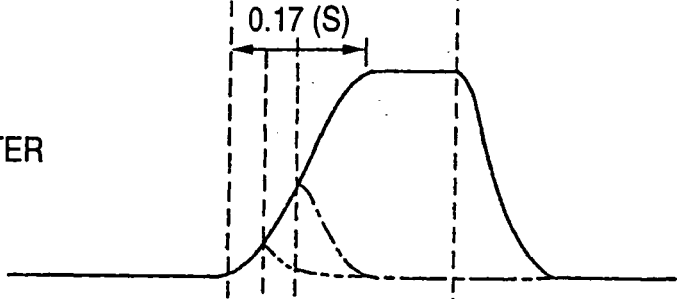
Figure 4:
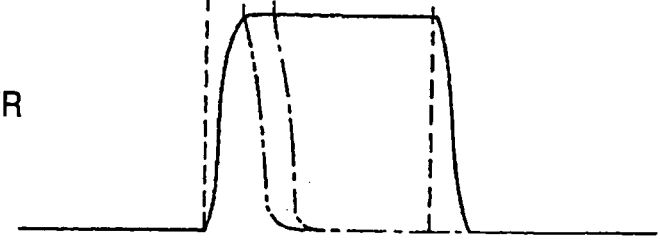
Figure 5:
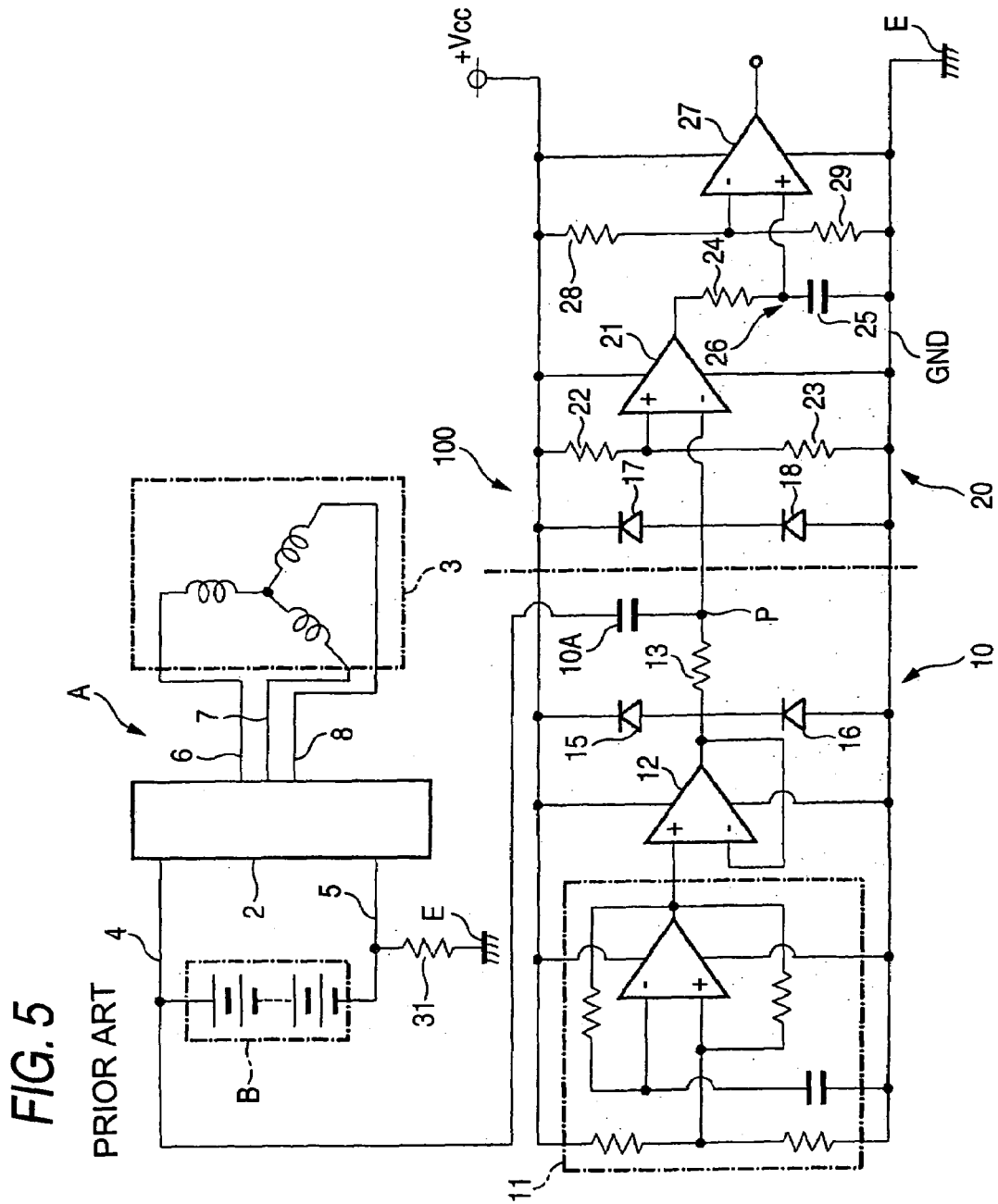
FIG. 5 is a circuit diagram showing an example of a usual earth detecting circuit.
Figure 6A:
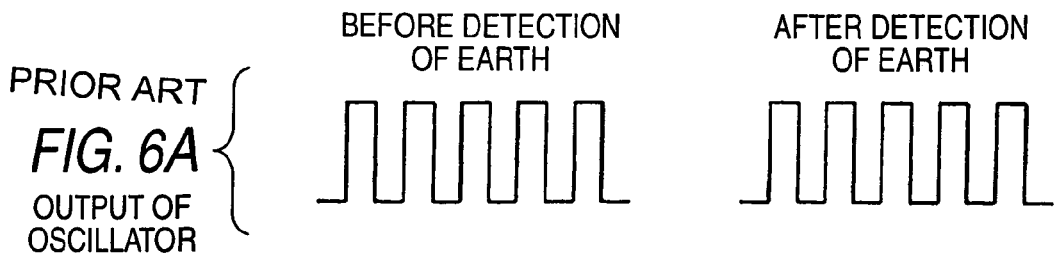
FIGS. 6A to 6E are waveform diagrams for explaining the operation of the earth detecting circuit shown in FIG. 5.
Figure 6B:
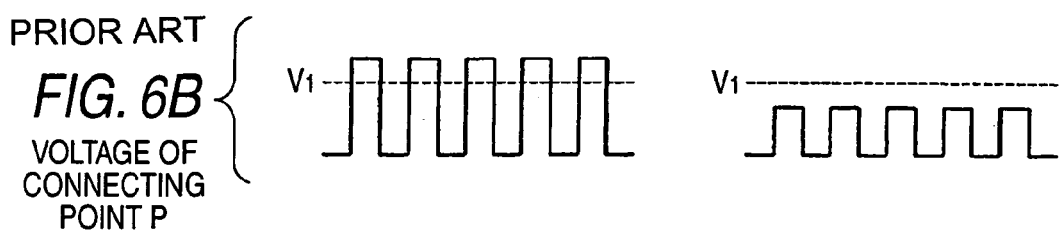
Figure 6C:
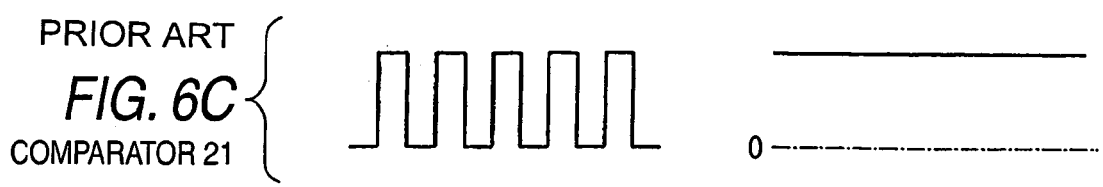
Figure 6D:
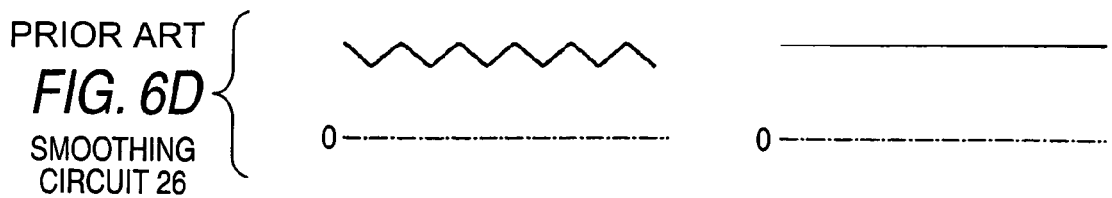
Figure 6E:
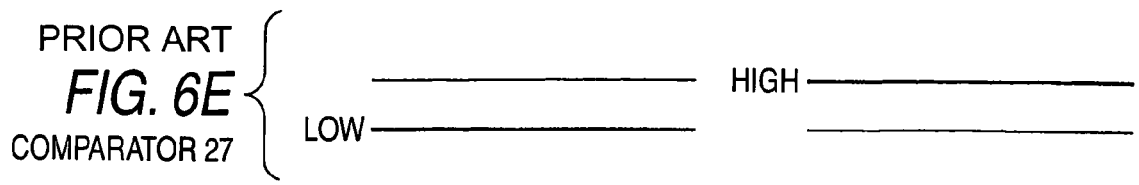

Accordingly, when the rectangular wave pulse signal P1 having the pulse width shorter than 0.17(s) is supplied (see a dashed line in FIG. 4(a)), before the output of the low-pass filter 53 increases to 5(V) as the peak value of the rectangular wave pulse signal P1, the supply of the rectangular wave pulse signal P1 is interrupted to have a peak value lower than 5(V) (see a dashed line in FIG. 4(b)). When the rectangular wave pulse signal P1 having a pulse width further shorter then 0.17(S) is supplied (see a two-dot chain line in FIG. 4 (a)), the peak value of the output of the low-pass filter 53 is also further lowered (see a two-dot chain line in FIG. 4 (b)).

Further, (b) of FIG. 2 is a graph showing the relation of the low-pass filter 53 relative to the pulse width of the rectangular wave pulse signal P1 during a failed state in which, for instance, the coupling condenser Co or the condenser Cf is opened in the insulation resistance fall detector 50.

As shown in (b) of FIG. 2, during the failed state, the peak value of the output of the low-pass filter 53 remains to be substantially constant. As apparent from the comparison of the full lines shown in FIGS. 4B and 4C, when the coupling condenser Co or the condenser Cf is opened to be failed, the time constant of the low-pass filter 53 is smaller than that during a normal state. Thus, the rise time of the output of the low-pass filter is smaller than that during the normal time.

As described above, under a state that the coupling condenser Co is opened, that is, the insulation resistance fall detector 50 is electrically disconnected from the insulation resistance Ri, the peak value of the output of the low-pass filter 53 relative to the supply of the rectangular wave pulse signal P1 is constantly equal to the peak value of the rectangular wave pulse signal P1. Therefore, even when the insulation resistance Ri is lowered, the output of the low-pass filter 53 is not lowered. Thus, the fall of the insulation resistance Ri cannot be inconveniently detected.

Further, when the condenser Cf of the low-pass filter 53 is opened, a signal component cannot be removed in the low-pass filter 53 and noise superimposed thereon is supplied to the control circuit 52 as it is. Accordingly, in this case, the fall of the insulation resistance Ri cannot be likewise inconveniently accurately detected.

Thus, in the state detecting method according to the present invention, the difference in the rise time of the output of the low-pass filter 53 between during the normal state and during the failed state is noticed. When the pulse width of the rectangular wave pulse signal P1 is decreased, if the peak value of the output of the low-pass filter 53 is considered to be varied, the normal state is detected. On the other hand, when the pulse width of the rectangular wave pulse signal P1 is decreased, if the peak value of the output of the low-pass filter 53 is considered to be, for instance, 3 (V) or higher and have no variation, the failed state is detected.

Figure 3:
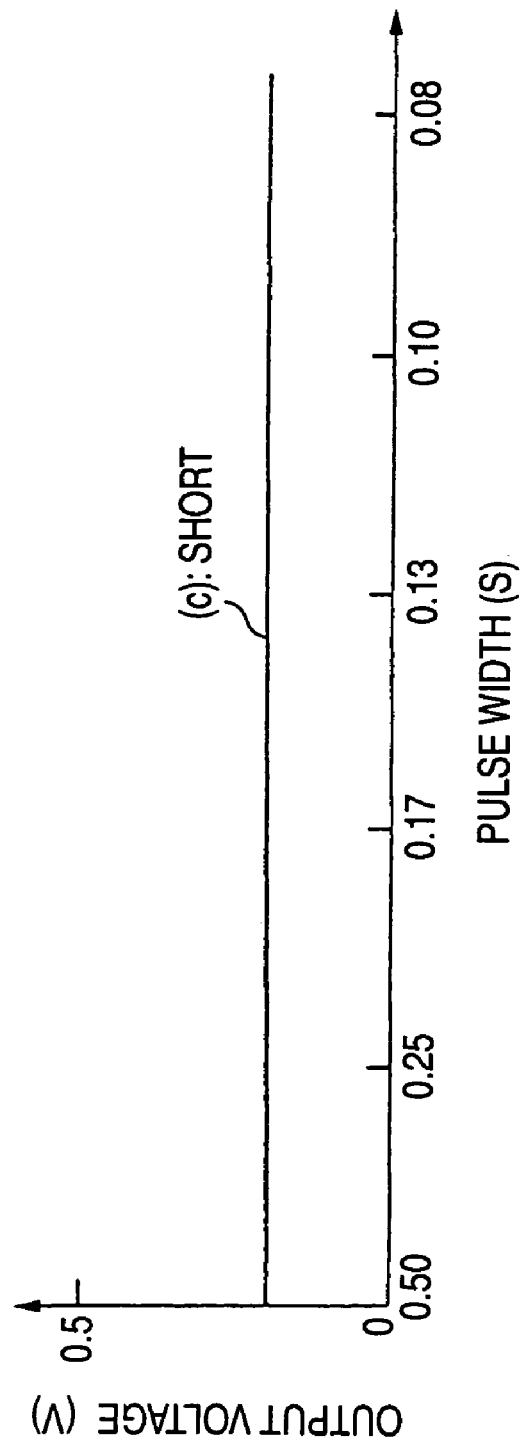
FIG. 3 is a graph showing the relation of the output voltage of the low-pass filter 53 relative to the pulse width of the rectangular wave pulse signal P1 during a shorted state.

FIG. 3 is a graph showing the relation of the peak value of the output of the low-pass filter 53 relative to the pulse width of the rectangular wave pulse signal P1 during the failed state in which, for instance, the coupling condenser Co or the condenser Cf is brought into a short circuit in the insulation resistance fall detector 50.

As described above, when the coupling condenser Co or the condenser Cf is shorted, even if the rectangular wave pulse signal P1 is outputted, the output of the low-pass filter 53 does not rise. Therefore, even when the pulse width is decreased, the peak value of the output of the low pass filter remains to be constant in the vicinity of 0.2(V).

As described above, when the coupling condenser Co or the condenser Cf is shorted, the peak value of the output of the low-pass filter 53 relative to the supply of the rectangular wave pulse signal P1 is constantly lowered. Therefore, even when the insulation resistance Ri is not lowered, the output of the low-pass filter 53 is lowered. Thus, the fall of the insulation resistance Ri cannot be undesirably detected.

Thus, in the state detecting method according to the present invention, when the pulse width of the rectangular wave pulse signal P1 is decreased, if the peak value of the output of the low-pass filter 53 is considered to be, for instance, 0.5 (V) or lower and have no variation, the failed state is detected.

An operation of the insulation resistance fall detector in which the state detecting method described in the above-described summary is carried out will be described below. Ordinarily, the control circuit 52 serves as a fall detecting unit and outputs the rectangular wave pulse signal P1 having the pulse width of 0.2(s) to detect the fall of the insulation resistance Ri on the basis of the peak value of the output of the low-pass filter 53 at this time. Specifically, when the peak value of the output of the low-pass filter 53 is substantially the same as the peak value of the rectangular wave pulse signal P1, it is decided that the insulation resistance is not lowered. On the other hand, when the peak value of the output of the low-pass filter 53 is decreased to reach a predetermined range (0.5(V) to 1.0(V)), the fall of the insulation resistance Ri is detected.

As described above, the predetermined range is set to a range larger than 0.5(V) for detecting the shorted and failed state. Accordingly, the detection of the fall of the insulation resistance Ri corresponding to the predetermined range, specifically, the detection of fall to several MΩ to several KΩ can be made compatible with the detection of the shorted and failed state.

The above-described control circuit 52 controls to stop the detection of the fall of the insulation resistance Ri by a predetermined trigger such as turning on an ignition switch. The control circuit 52 starts the detection of the state of the insulation resistance fall detector 50, serves as a pulse width varying unit and varies the pulse width of the rectangular wave pulse signal P1 to 0.09(s) from 0.2(s) by controlling the duty of the rectangular wave pulse signal P1.

Then, the control circuit serves as a state detecting unit. When the rectangular wave pulse signal P1 having the pulse width of 0.2(s) is outputted, the peak value of the output of the low-pass filter 53 is not lower than 3(V). When the rectangular wave pulse signal P1 having the pulse width of 0.09(s) is outputted, the peak value of the output of the low-pass filter 53 is not higher than 2(V). At this time, the control circuit 52 decides that as the pulse width decreases, the peak value also decreases to detect that the insulation resistance fall detector 50 is in the normal state.

On the other hand, when the rectangular wave pulse signal P1 having the pulse width of 0.2(s) and the rectangular wave pulse signal P1 having the pulse width of 0.09(s) are outputted, both the peak values of the outputs of the low-pass filter 53 are not lower than 3V. At this time, even when the pulse width decreases, if the peak value is not lower than 3V and has no variation, the control circuit 52 detects that the insulation resistance fall detector 50 is in the opened and failed state.

Further, when the rectangular wave pulse signal P1 having the pulse width of 0.2(s) and the rectangular wave pulse signal P1 having the pulse width of 0.09(s) are outputted, both the peak values of the outputs of the low-pass filter 53 are not higher than 0.5V. At this time, even when the pulse width decreases, if the peak value is not higher than 0.5V and has no variation, the control circuit 52 detects that the insulation resistance fall detector 50 is in the shorted and failed state.

According to the state detecting method, when the pulse width is varied so as to be short, the difference in the rise time of the output of the low-pass filter 53 between during the normal state and during the failed state appears as the difference in the peak value of the output of the low-pass filter 53. Thus, the state of the insulation resistance fall detector 50 itself can be detected on the basis of the output of the low-pass filter 53 when the pulse width is varied.

Further, in the insulation resistance fall detector 50, when the pulse width is 0.2(s) and 0.09(s), both the peak values of the outputs of the low-pass filter 53 are not lower than 3V corresponding to a third predetermined value in claims. At this time, the control circuit 52 considers the output of the low-pass filter 53 to be not lower than 3V and have no variation and detects the failed state.

Thus, when the failure that the coupling condenser Co is opened or the condenser Cf is opened (that is, the failure of the low-pass filter 53) etc., the time constant of the low-pass filter 53 is lowered and the rise time of the output of the low-pass filter 53 to the output of the rectangular wave pulse signal P1 is shorter than that during the normal state is generated, the failed state can be detected. Further, the output of the low-pass filter 53 may be compared with 3V to simply decide that the peak value of the output of the low-pass filter 53 is not lower than 3V and has no variation.

Further, in the insulation resistance fall detector 50, when the pulse width is 0.2(s) and 0.09(s), both the peak values of the outputs of the low-pass filter 53 are not higher 0.5(V) corresponding to a fourth predetermined value in claims. At this time, the control circuit 52 considers the output of the low-pass filter 53 to be not higher than 0.5V and have no variation and detects the failed state.

Thus, when the failure that the output of the low-pass filter 53 does not rise in accordance with the output of the rectangular wave pulse signal P1 such as the short-circuit of the coupling condenser Co or the condenser Cf is generated, the failed state can be detected. Further, the output of the low-pass filter 53 may be compared with 0.5(V) to simply decide that the peak value of the output of the low-pass filter 53 is not higher than 0.5(V) and has no variation.

In the above-described insulation resistance fall detector 50, when the pulse width is 0.2(s), the peak value of the output of the low-pass filter 53 is not lower than 3(V) corresponding to a first predetermined value in claims, and when the pulse width 0.09(s), the peak value is not higher than 2(V) corresponding to a second predetermined value in claims. At this time, the control circuit decides that the insulation resistance fall detector is in the normal state. Thus, the low-pass filter 53 may be compared with 3(V) and 2(V) to simply decide that the peak value of the output of the low-pass filter 53 is varied.

Further, in the insulation resistance fall detector 50, the pulse width of the rectangular wave pulse signal P1 can be varied by the simple structure that the duty of the rectangular wave pulse signal P1 is varied.

In the above-described embodiments, the control circuit 52 is composed of the microcomputer. However, the control circuit may be composed of, for instance, a comparator.

The present invention is described by way of the above-described embodiments, however, the present invention is not limited to the embodiment. The pulse width or the first to fourth predetermined values may be variously changed or modified as described above within the scope of the gist of the present invention.

What is claimed is:

1. A method of detecting a state of an insulation resistance fall detector that includes: a detection resistance connected in series to an insulation resistance between a vehicle body and a DC power source; a coupling condenser provided between the insulation resistance and the detection resistance; a pulse signal applying unit that applies a pulse signal to a serial circuit constituted by the insulation resistance, the coupling condenser and the detection resistance; a filter that removes a signal component of a predetermined frequency from a voltage of a connecting point between the coupling condenser and the detection resistance; and a fall detecting unit that detects a fall of the insulation resistance on the basis of the output of the filter, the method comprising the steps of:
    varying a pulse width of the pulse signal; and
    detecting the state of the insulation resistance fall detector on the basis of the output of the filter when the pulse width is varied.

2. The method according to claim 1, wherein the pulse width of the pulse signal is varied so as to be shorter than a pulse width outputted when a detection is carried out by the fall detecting unit.

3. The method according to claim 2, wherein a normal state of the insulation resistance fall detector is detected if the output of the filter is considered to change at the time of varying the pulse width so as to be short.

4. The method according to claim 3, wherein
    the pulse signal of a first pulse width is outputted upon detection by the fall detecting unit,
    the pulse signal of a second pulse width shorter than the first pulse width is outputted upon detection of the state of the fall detecting unit,
    when the output of the filter upon outputting the pulse signal of the first pulse width is not lower than a first predetermined value and the-output of the filter upon outputting the pulse signal of the second pulse width is not higher than a second predetermined value smaller than the first predetermined value, a normal state of the insulation resistance fall detector is detected.

5. The method according to claim 2, wherein a failed state of the insulation resistance fall detector is detected if the output of the filter is considered to be a third predetermined value or higher and have no variation at the time of varying the pulse width so as to be short.

6. The method according to claim 5, wherein the failed state of the insulation resistance fall detector is detected if the output of the filter is considered to be not higher than a fourth predetermined value smaller than the third predetermined value and have no variation at the time of varying the pulse width to be short.

7. The method according to claim 1, wherein a duty of the pulse signal is varied to vary the pulse width.

8. An insulation resistance fall detector for detecting an insulation resistance between a vehicle body and a DC power source, the insulation resistance fall detector comprising:
    a detection resistance connected in series to the insulation resistance;
    a coupling condenser provided between the insulation resistance and the detection resistance;
    a pulse signal applying unit that applies a pulse signal to a serial circuit constituted by the insulation resistance, the coupling condenser and the detection resistance;
    a filter that removes a signal component of a predetermined frequency from a voltage of a connecting point between the coupling condenser and the detection resistance;
    a fall detecting unit that detects a fall of the insulation resistance on the basis of the output of the filter;
    a pulse width varying unit that varies a pulse width of the pulse signal; and
    a state detecting unit that detecting a state of the insulation resistance fall detector on the basis of the output of the filter when the pulse width is varied.

9. The insulation resistance fall detector according to claim 8, wherein the filter includes a low pass filter.

* * * * *